United States Patent [19]

Yahiro

[11] Patent Number: 5,683,940
[45] Date of Patent: Nov. 4, 1997

[54] METHOD OF DEPOSITING A REFLOW $SiO_2$ FILM

[75] Inventor: Kazuyuki Yahiro, Kawasaki, Japan

[73] Assignee: Kabushiki Kaisha Toshiba, Kawasaki, Japan

[21] Appl. No.: 575,851

[22] Filed: Dec. 20, 1995

[30] Foreign Application Priority Data

Dec. 26, 1994 [JP] Japan .................... 6-322950

[51] Int. Cl.$^6$ .................................... H01L 21/316
[52] U.S. Cl. ............................ 437/195; 437/238
[58] Field of Search ...................... 437/195, 228, 437/238, 982

[56] References Cited

U.S. PATENT DOCUMENTS

| 5,190,792 | 3/1993 | Blum et la. ............... 427/560 |
| 5,314,724 | 5/1994 | Tsukune et al. ........... 427/489 |

FOREIGN PATENT DOCUMENTS 0519079  12/1992  European Pat. Off. ...... H01L 21/312

OTHER PUBLICATIONS

C.D. Dobson et al., "Advanced $SiO_2$ Planarization Using Silane and $H_2O_2$", Semiconductor International, pp.85–88 (1994).

M. Matsuura et al., "Novel Self-Planarizing CVD Oxide for Interlayer Dielectric Applications", IEEE, pp. 117–120 (1994).

*Primary Examiner*—Charles L. Bowers, Jr.
*Assistant Examiner*—Matthew Whipple
*Attorney, Agent, or Firm*—Finnegan, Henderson, Farabow, Garrett & Dunner, L.L.P.

[57] ABSTRACT

In a method of manufacturing a semiconductor device, a first plasma insulating film having a thickness of 0.1 μm or more is formed on the semiconductor substrate with lower-surface wirings thereon. The semiconductor substrate is moved into a pressure-reduced CVD device, and then an $SiH_4$ gas and $H_2O_2$ are supplied into the pressure-reduced CVD device to react them to each other in a vacuum of 650 Pa or less within the temperature range of –10° C. to +10° C. to form a reflow $SiO_2$ film having a thickness of 0.4 μm to 1.4 μm on the semiconductor substrate. The semiconductor substrate is put in a vacuum of 6.5 pascal for 30 seconds or more. Thereafter, the semiconductor substrate is put at a high temperature of 300° C. to 450° C. for 120 to 600 seconds. A second plasma insulating film having a thickness of 0.3 μm or more and serving as a cap film is formed on the semiconductor substrate. The crack resistance of the reflow insulating film formed in the above steps is improved, and the flatness of the reflow insulating film is improved.

10 Claims, 5 Drawing Sheets

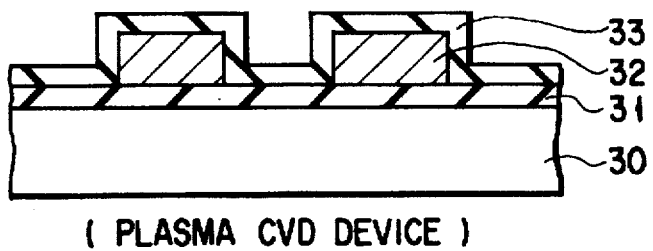
FIG. 2A (PLASMA CVD DEVICE)
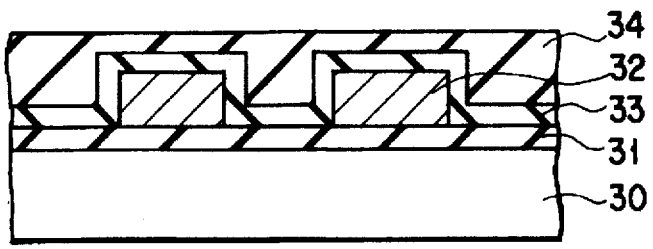
FIG. 2B (REDUCED-PRESSURE CVD DEVICE)
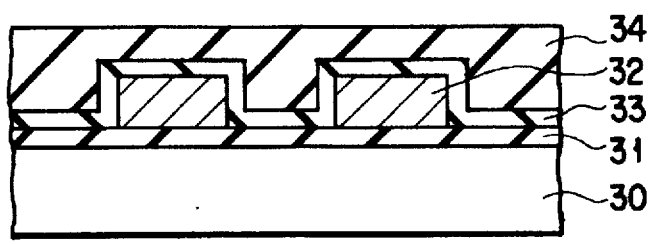
FIG. 2C (REDUCED-PRESSURE CVD DEVICE)
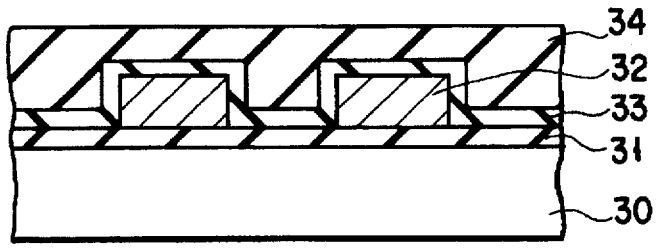
FIG. 2D (PLASMA CVD DEVICE)
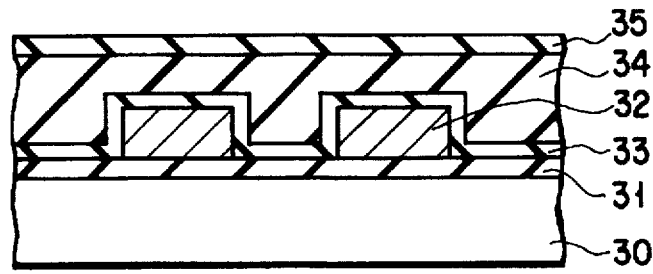
FIG. 2E (PLASMA CVD DEVICE)

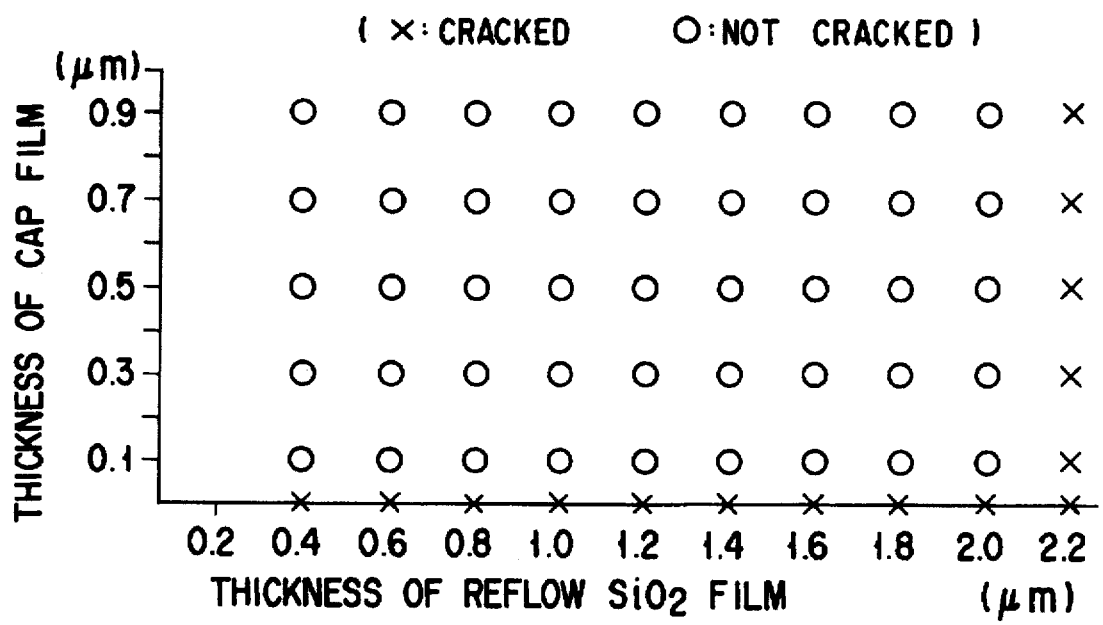
F I G. 5

METHOD OF DEPOSITING A REFLOW SiO₂ FILM

BACKGROUND OF THE INVENTION

1. Field of the Invention

The present invention relates to a method of manufacturing semiconductor devices and, more particularly, to an improvement on forming an interlayered insulating layer of semiconductor devices having a multi-layered wiring layer structure.

2. Description of the Related Art

With an increase in packing density of semiconductor devices, a multi-layered wiring structure in which a number of wiring layers are formed on a semiconductor substrate has been developed, and the number of steps of structuring such multi-layered wiring layers has increased.

In particular, a large part of manufacturing cost is occupied by the steps of forming multi-layered wiring layers. In order to reduce the cost of semiconductor devices, a reduction of the steps of forming multi-layered wiring layers has been demanded.

Conventional steps of forming multi-layered wiring layers will be described below. A first wiring material for lower wiring layers is deposited on a semiconductor substrate, and then, the deposited wiring material layer is patterned to form a plurality of lower wirings. A first insulating layer is formed on the lower wiring layers to bury the gaps between the lower wirings. At this time, step configuration is present on the surface of the first insulating film depending on the lower wiring pattern. The step configuration adversely affects to deposition of a second wiring material for an upper wiring layer and patterning of the upper wiring material layer, which are carried out in the following steps, so that serious defects such as disconnection or short circuit of the upper wirings may occur.

In general, before the second wiring material is deposited on the first insulating layer serving as an underlying layer, the surface of the first insulating film is flattened by etch back to remove the step configuration, and the second insulating material is deposited on the flattened surface of the first insulating layer.

Therefore, the conventional method of forming the interlayered insulating layer structure in which the first and second insulating films are superposed include an increased number of steps, i.e., formation of the first insulating film, flattening of the surface of the first insulation film, and formation of the second insulating film. This is a large hindrance to the demand for the reduction of the steps of forming the multi-layered wiring layers.

In place of the method of flattening the surface of the first insulating film, a method of moderating the step configuration on the surface of the first insulating film by forming an SOG (Spin on Glass) film of an insulating material on the first insulating film is available.

However, this method requires an increased number of annealing steps of forming of the SOG film. Furthermore, an undesired portion of the SOG film must be removed by etch back to assure the reliability of the upper wiring layer. As a result, the method requires an increased number of steps, and does not sufficiently cope with the demand for the reduction of the steps of forming multi-layered wiring layers.

Recently, as one of techniques coping with the reduction of the steps of forming multi-layered wiring layers, the following method has attracted attention. That is, in formation of an interlayered insulating layer on the lower wiring layers, an $SiH_4$ gas reacts to $H_2O_2$ (hydrogen peroxide water) serving as an oxidant at a low temperature (e.g., about 0° C.) in a vacuum state to form a self-flow type (reflow) insulating film (to be referred to as a reflow insulating film hereinafter) on the lower wiring layer.

According to this method, the formation of an insulating film (reflow insulating film) and flattening of the surface of the insulating film can be simultaneously achieved. That is, in the step of forming the insulating film, film formation and flattening can be simultaneously achieved. For this reason, a reduction of the steps of forming multi-layered wiring layers can be realized.

However, in the method of forming the reflow insulating film, as is apparent from its reaction manner, moisture ($H_2O$) is generated during formation of the insulating film, and thus the insulating film has a high moisture content. The reflow insulating film tends to crack mainly when it is subjected to annealing (e.g., at 450° C. for 30 minutes) at a later step.

FIG. 6 shows data obtained by actually measuring the state wherein cracks are formed in the reflow $SiO_2$ film formed by the conventional method. In this case, the thickness of the reflow $SiO_2$ film and the thickness of an SiO film (to be referred to as a cap film hereinafter) formed on the reflow $SiO_2$ film by a general plasma CVD (Chemical Vapor Deposition) method are used as parameters. Upon completion of the film formation, these films are annealed at 450° C. for 30 minutes.

As is apparent from FIG. 6, regardless of the presence/absence of the cap film, cracks are formed when the thickness of the reflow $SiO_2$ film is 1.1 µm or more. In other words, the allowable thickness of the reflow $SiO_2$ film has an upper limit from the view point of crack resistance. The upper limit is as low as 1.0 µm.

However, in order to form a reflow $SiO_2$ film which is sufficiently flattened, the reflow $SiO_2$ requires a thickness of a considerable extent.

When the cap film is formed on the reflow $SiO_2$ film by a general plasma CVD, a semiconductor wafer is not still sufficiently heated up. For this reason, a cap film having a low wet etching rate is formed. Since the etching rate of the cap film is low, an abnormal configuration is formed between the cap film and the reflow $SiO_2$ film in an etching step performed upon completion of the step of forming a cap film, for forming a through-hole or a via-hole in the reflow $SiO_2$ film and the cap film. The abnormal configuration degrades the coverage of an upper wiring layer formed in the following step, and causes a connection failure of the upper wiring layer.

As described above, the thickness of a reflow $SiO_2$ film obtained when a reflow insulating film forming technique is applied to the steps of forming an interlayered insulating layer of the conventional steps of forming multi-layered wiring layers is to be increased to flatten the reflow $SiO_2$ film, however, the upper limit of the thickness is inadvantageously suppressed to a low level from a viewpoint of crack resistance.

In addition, an abnormal configuration is formed between the cap film and the reflow $SiO_2$ film in an etching step for forming a through-hole or a via-hole in the reflow $SiO_2$ film and the cap film formed thereon. The abnormal configuration degrades the coverage of the upper wiring layer, and causes a connection failure of the upper wiring layer.

SUMMARY OF THE INVENTION

The present invention has been made in consideration of the above problem, and has as its object to provide a method of manufacturing a semiconductor device in which the crack resistance of a reflow insulating film obtained when a reflow insulating film forming technique is applied to the steps of forming an interlayered insulating layer of the steps of forming multi-layered wiring layers of semiconductor devices is improved to obtain a desirable thickness capable of flattening the reflow insulating film, and the reliability of an upper wiring layer formed after the interlayered insulating layer is formed can be improved.

According to the present invention, there is provided a method of manufacturing a semiconductor device, characterized by comprising the steps of supplying an $SiH_4$ gas and $H_2O_2$ into a reaction chamber in which a semiconductor substrate having an insulating film formed thereon is placed to cause the $SiH_4$ gas and $H_2O_2$ to react to each other in a vacuum below 650 Pa within the temperature range of $-10°$ C. to $+10°$ C. to form a reflow $SiO_2$ film having a thickness of 0.4 μm to 1.4 μm on the semiconductor substrate; putting the semiconductor substrate in the reaction chamber in vacuum for more than 30 seconds; and putting the semiconductor substrate at a high temperature of 300° C. to 450° C. for 120 seconds to 600 seconds.

The step of forming the insulating film to the step of forming the reflow $SiO_2$ film may be continuously performed in vacuum.

In the method of the present invention, a reflow insulating film forming technique is applied to the steps of forming an interlayered insulating layer of the steps of forming multi-layered wiring layers to form a reflow $SiO_2$ film, and the semiconductor, substrate is put in a vacuum of a predetermined pascal for a predetermined time or more. In addition, the semiconductor substrate is put at a predetermined high temperature for a predetermined time or more to reduce the moisture content contained in the reflow $SiO_2$ film, so that crack resistance can be improved.

Since, in this way, the clack resistance of the reflow $SiO_2$ film is improved, the reflow insulating film can assure a desired thickness capable of flattening the reflow insulating film. Thus, the flatness of the surface of the interlayered insulating layer can be improved, and the upper wiring layer formed on the interlayered insulating layer can be micro-patterned.

In addition, an abnormal configuration is not formed between the cap film and the reflow $SiO_2$ film in an etching step for forming a through-hole or a via-hole in the insulating layers. Therefore, degradation of coverage of an upper wiring layer formed in the following steps or a conduction failure of the upper wiring layer are not caused, and the reliability of the upper wiring layer can be improved.

According to the present invention, there is further provided a method of manufacturing a semiconductor device, comprising the steps of: causing a gas to react with $H_2O_2$ in vacuum to form an insulating film having a substantially flat surface on a semiconductor substrate; putting the semiconductor substrate in a first condition; and putting the semiconductor substrate in a second condition.

The thickness of the insulating film may be substantially 0.4 μm to 1.4 μm.

The step of causing the gas to react with $H_2O_2$ is carried out in substantially below than 650, at a predetermined temperature range of $-10°$ C. to $+10°$ C., an $SiO_4$ gas being used as the gas.

The first condition may be such that the semiconductor substrate is put in vacuum for substantially more than 30 seconds.

The second condition is such that the semiconductor substrate is put at a temperature of substantially 300° C. to 450° C. for substantially 120 seconds to 600 seconds.

The method may further comprise a step performed after the putting step of the semiconductor substrate at the high temperature, for forming an insulating film on the reflow $SiO_2$ film.

The method may further comprise a step carried out carried out after the insulating film forming step, of annealing the semiconductor substrate at a temperature of 450° C. for 30 minutes.

According to the present invention, there is still further provided a method of manufacturing a semiconductor device, comprising the steps of: placing a semiconductor substrate with wirings thereon into a reaction chamber of a plasma CVD device of a manufacturing device; forming a plasma $SiO_2$ film on the semiconductor substrate having a thickness of more than 0.1 μm in the reaction chamber of the plasma CVD device; moving the semiconductor substrate from the reaction chamber of the plasma CVD device into a reaction chamber of a pressure-reduced CVD device of the manufacturing device; supplying an $SiH_4$ gas and $H_2O_2$ into the reaction chamber of the pressure-reduced CVD device in which the semiconductor substrate is placed to cause the $SiH_4$ gas and $H_2O_2$ to react to each other in a vacuum below 650 Pa within the temperature range of $-10°$ C. to $+10°$ C. to form a reflow $SiO_2$ film having a thickness of 0.4 μm to 1.4 μm on the semiconductor substrate; putting the semiconductor substrate, still retained in the reaction chamber of the pressure-reduced CVD device, in vacuum for more than 30 seconds; moving the semiconductor substrate from the reaction chamber of the pressure-reduced CVD device to the reaction chamber of the plasma CVD device; and putting the semiconductor substrate, in the reaction chamber of the plasma CVD device, at a high temperature of 300° C. to 450° C. for 120 seconds to 600 seconds.

The moving steps may be carried out by an arm provided in the manufacturing device.

The method may further comprise a step performed after the putting step of the semiconductor substrate at the high temperature, for forming an insulating film on the reflow $SiO_2$ film.

The method may further comprise a step after the insulating film forming step, of annealing the semiconductor substrate at a temperature of 450° C. for 30 minutes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 2A to 2E are sectional views showing semiconductor structures in the steps of forming multi-layered wiring layers when a reflow insulating film forming technique is applied to the steps of forming an interlayered insulating layer according to an embodiment of the method of manufacturing semiconductor devices of the present invention;

FIG. 5 is a graph showing crack formation when the thickness of a reflow $SiO_2$ film obtained in the steps of the embodiment of the present invention and the thickness of a cap SiO film formed on the reflow $SiO_2$ film are used as parameters.

DETAILED DESCRIPTION OF THE PREFERRED EMBODIMENTS

An embodiment of the present invention will be described with reference to the accompanying drawings.

Figure 1A:
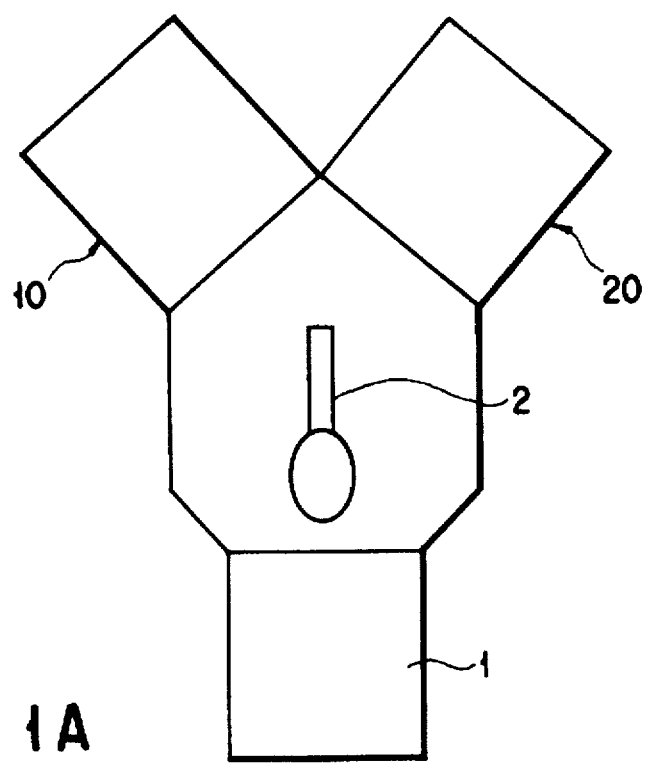
FIGS. 1A to 1C are schematic view showing an arrangement of a semiconductor manufacturing apparatus used in an embodiment of a method of manufacturing semiconductor devices according to the present invention.

FIG. 1A schematically shows an arrangement of a semiconductor manufacturing apparatus used in an embodiment of a method of manufacturing semiconductor devices according to the present invention.

Referring to FIG. 1A, reference numeral 10 denotes a plasma CVD device; 20, a reduced-pressure CVD device; 1, a cassette loader chamber in which a semiconductor substrate is set; and 2, a robot arm for conveying (i.e., loading/unloading) the semiconductor substrate between the cassette loader chamber 1 and the reaction chamber of the plasma CVD device 10 or the reaction chamber of the reduced-pressure CVD device 20.

Figure 1B:
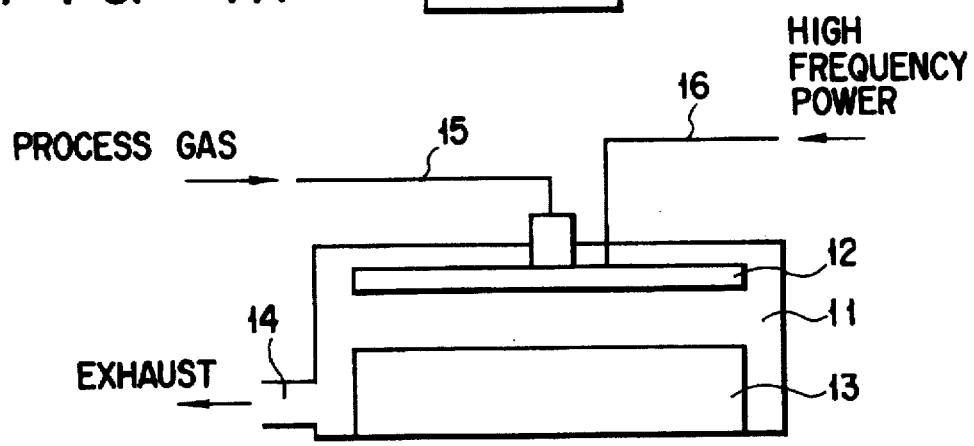

The plasma CVD device 10 has a general arrangement. This arrangement is schematically shown in FIG. 1B. Referring to FIG. 1B, reference numeral 11 denotes a reaction chamber (chamber); 12, an upper electrode (shower head); 13, a lower electrode (table); 14, an exhaust port; 15, a process gas supply path; and 16, a high frequency power supply path.

Figure 1C:
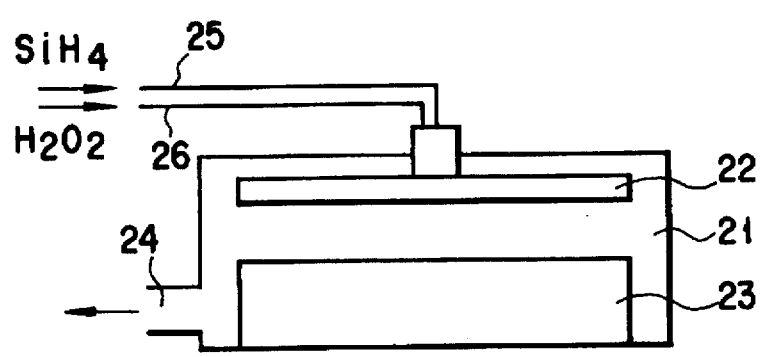

The reduced-pressure CVD device has a general arrangement. This arrangement is schematically shown in FIG. 1C. Referring to FIG. 1C, reference numeral 21 denotes a reaction chamber (chamber); 22, an upper electrode (shower head); 23, a lower electrode (table); 24, an exhaust port; 25, an $SiH_4$ gas supply path; and 26, an $H_2O_2$ supply path.

FIGS. 2A to 2E show the cross-sections of semiconductor structures in the steps of forming multi-layered wiring layers when a reflow insulating film forming technique is applied to the steps of forming an interlayered insulating layer according to an embodiment of a method of manufacturing semiconductor devices of the present invention.

The steps of forming multi-layered wiring layers when the reflow insulating film forming technique is applied to the steps of forming an interlayered insulating layer according to an embodiment of a method of manufacturing semiconductor devices of the present invention will be described hereinafter with reference to FIGS. 1A to 1C, FIGS. 2A to 2E.

As shown in FIG. 2A, a first wiring material (e.g., aluminum) for a lower wiring layer is deposited on an insulating film 31 on a semiconductor substrate 30 by, e.g., a sputtering method, and the first wiring material layer is patterned by using a photolithography technique and a reactive ion etching (RIE) technique to form a plurality of lower wiring layers 32.

An insulating film is buried between the lower wiring layers 32 and deposited on the upper surfaces of the lower wiring layers using the semiconductor manufacturing apparatus as shown in FIG. 1A, to form an interlayered insulating layer formed on the semiconductor substrate 30.

More specifically, in the step of forming the interlayered insulating layer, the semiconductor substrate 30 on which the lower wiring layers 32 are formed is set on, e.g., a quartz board (not shown) in the cassette loader chamber 1.

The cassette loader chamber 1 is set in vacuum by using a vacuum pump (not shown), and the semiconductor substrate 30 is loaded into the reaction chamber 11 of the plasma CVD device 10 by the robot arm 2. The temperature in the reaction chamber 11 of the plasma CVD device 10 is set to about 300° C. in advance, and a first plasma $SiO_2$ film 33 having a thickness of 0.1 μm or more (100 nm in this embodiment) is formed by a general plasma CVD method on the surface of the semiconductor substrate 30, i.e., on the exposed surface of the lower wiring layers 32 and the exposed surface of the insulating film 31 between the lower wiring layers 32.

The semiconductor substrate 30 is moved from the reaction chamber 11 of the plasma CVD device 10 into the reaction chamber 21 of the reduced-pressure CVD device 20 by the robot arm 2. An $SiH_4$ gas and $H_2O_2$ are supplied from an $SiH_4$ gas supply source and an $H_2O_2$ supply source into the reaction chamber 21 of the reduced-pressure CVD device 20 through the $SiH_4$ gas supply path 25 and the $H_2O_2$ supply path 26, respectively, and react to each other in a vacuum of 650 Pa or less in a temperature range of $-10°$ C. to $+10°$ C. (e.g., 0° C.). As a result, as shown in FIG. 2B, a reflow $SiO_2$ film 34 having a thickness falling within the range of 0.4 μm to 1.4 μm is formed on the semiconductor substrate 30, i.e., on the first plasma $SiO_2$ film 33. The thickness of the reflow $SiO_2$ film 34 means a thickness of that portion of the reflow $SiO_2$ film 34 which portion is formed on that layer formed on the semiconductor substrate 30, which layer has a flat surface and has a large size of e.g. about 100 μm long×100 μm wide. The flat surface layer is typically bonding pads formed on the semiconductor substrate, though not shown.

As shown in FIG. 2C, the semiconductor substrate 30 still retained in the reaction chamber 21 of the reduced-pressure CVD device is put in a vacuum of 6.5 Pa or less for 30 seconds or more (30 seconds in this embodiment).

The semiconductor substrate 30 is then moved from the reaction chamber 21 of the reduced-pressure CVD device 20 into the reaction chamber 11 of the plasma CVD device 10 by the robot arm 2. As shown in FIG. 2D, the semiconductor substrate 30 is put in the reaction chamber 11 of the plasma CVD device 10 at a high temperature falling within the range of 300° C. to 450° C. (300° C. in this embodiment) for a time falling within the range of 120 seconds to 600 seconds (120 seconds in this embodiment).

Thereafter, in the reaction chamber 11 of the plasma CVD device 10, as shown in FIG. 2E, a second plasma $SiO_2$ film 35 serving as a cap film having a thickness of 0.3 μm or more (300 nm in this embodiment) is formed by a plasma CVD method on the surface of the semiconductor substrate 30, i.e., on the reflow $SiO_2$ film 34.

Thereafter, the semiconductor substrate 30 is removed from the semiconductor manufacturing apparatus, and furnace annealing is performed at 450° C. for 30 minutes by using another semiconductor manufacturing apparatus.

Thereafter, an etching step is carried out to form a contact-hole or via-hole (not shown) in these insulating films. Then, a second wiring material for an upper wiring layer is deposited on the semiconductor substrate 30, i.e., on the second plasma $SiO_2$ film 35 and the exposed portion of the substrate 30. The second wiring material layer (not shown) is patterned to form the upper wiring layer.

The following table shows a comparison data between the prior art and the embodiment the present invention, of the change of moisture contents (%) in reflow $SiO_2$ film 34 in the following steps.

TABLE

|  | Moisture contents (%) in reflow $SiO_2$ film 34 | |
| --- | --- | --- |
|  | Prior art | Present invention |
| When reflow $SiO_2$ film 34 has been formed (FIG. 2B) | 100 | 100 |
| After semiconductor substrate 30 has been put in vacuum below 6.5 Pa for 30 seconds (FIG. 2C) | — | 70 |
| After semiconductor substrate 30 has been put at 300° C. for 120 seconds (FIG. 2D) | 50 | 50 |
| When cap film 35 has been formed (FIG. 2E) | 20 | 20 |
| After semiconductor substrate 30 has been annealed at 450° C. for 30 minutes | 5 | 5 |

As is understood from the table, in the embodiment of the present invention, moisture contained in the reflow $SiO_2$ film 34 was gently changed in the following steps, while in the prior art it was sharply changed. To describe more specific, in the embodiment of the present invention, the semiconductor substrate 30 was first put in vacuum below 6.5 for 30 seconds. With this step, the contained moisture in the reflow $SiO_2$ film 34 was changed from 100% to 70%. Then, the semiconductor substrate 30 was put at 300° C. for 120 seconds. With this step, the contained moisture in the reflow $SiO_2$ film 34 was changed from 70% to 50%. Thereafter, the cap $SiO_2$ film 35 was formed on the semiconductor substrate 30, i.e. on the reflow $SiO_2$ film 34. With this step, the contained moisture in the reflow $SiO_2$ film 34 was changed from 50% to 20%. After that the semiconductor substrate 30 was annealed at 450° C. for 30 minutes. With this step, the contained moisture in the reflow $SiO_2$ film 34 was changed from 20% to 5%. In this way, since in the present invention the moisture contained in the reflow $SiO_2$ film 34 was changed in the four steps, i.e., stepwise to 70%, 50%, 20% and 5%. That is, according to the present invention, the moisture contained in the reflow $SiO_2$ film 34 was gently reduced. In particular, according to the present invention, there is added a step performed after the step in which reflow $SiO_2$ film 34 was formed, of putting the semiconductor substrate 30 vacuum, so that the moisture contained in the reflow $SiO_2$ film 34 was prevented from being abruptly reduced from 100% to 50% as conventional, resulting in minimum possibility of the reflow $SiO_2$ film 34 being cracked when the semiconductor substrate 30 was annealed after the cap $SiO_2$ film was formed.

In the prior art, a step corresponding to the step of putting the semiconductor in vacuum below 6.5 Pa for 30 seconds was not carried out. Thus, the contained moisture in the reflow $SiO_2$ film 34 was changed from 100% to 50% at one step. This abrupt change of the contained moisture in the reflow $SiO_2$ film 34 will cause cracks in the reflow $SiO_2$ film 34 when the semiconductor substrate 30 is annealed after the cap $SiO_2$ film was formed.

Figure 3:
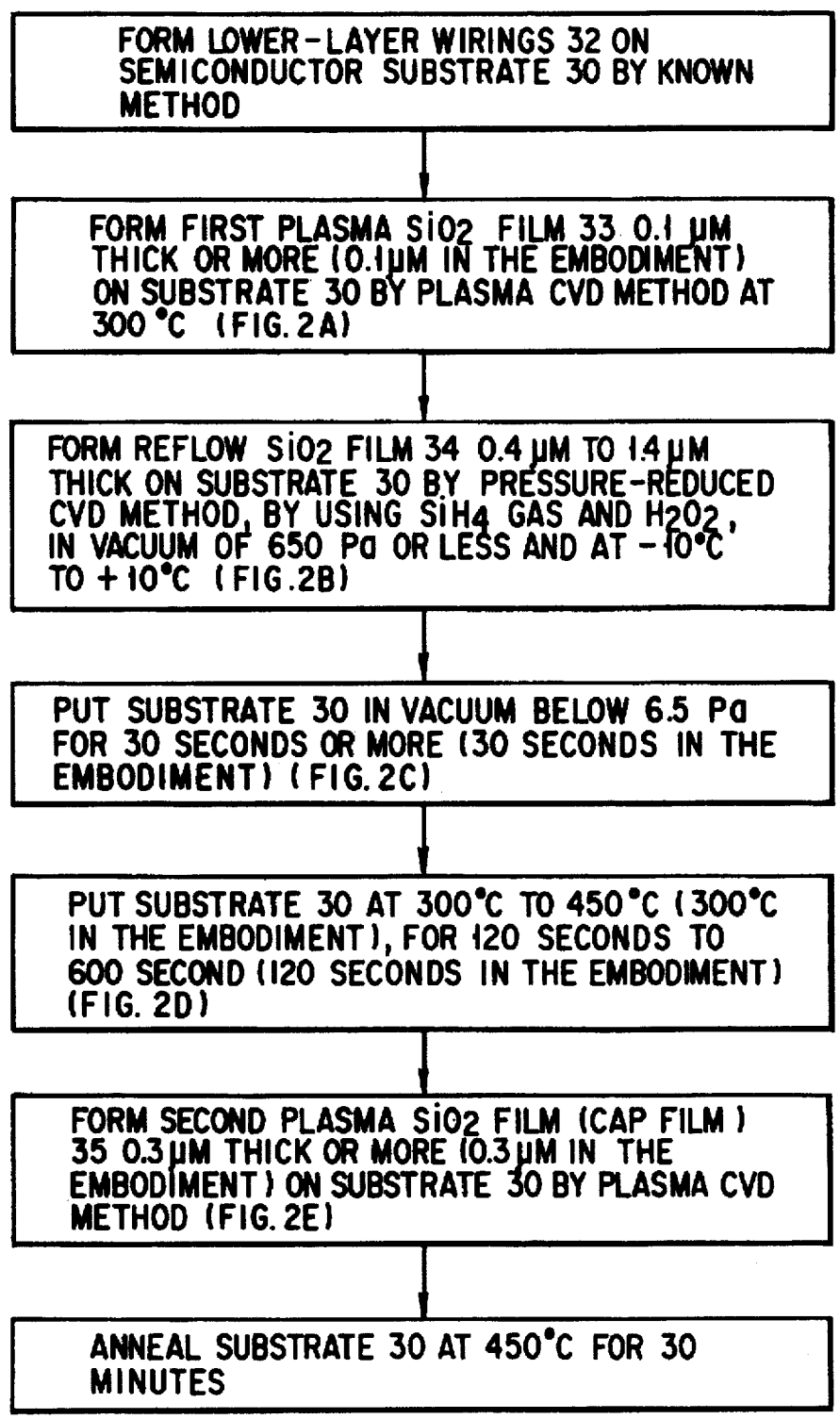
FIG. 3 is a flow chart showing the steps of the embodiment.
Figure 4:
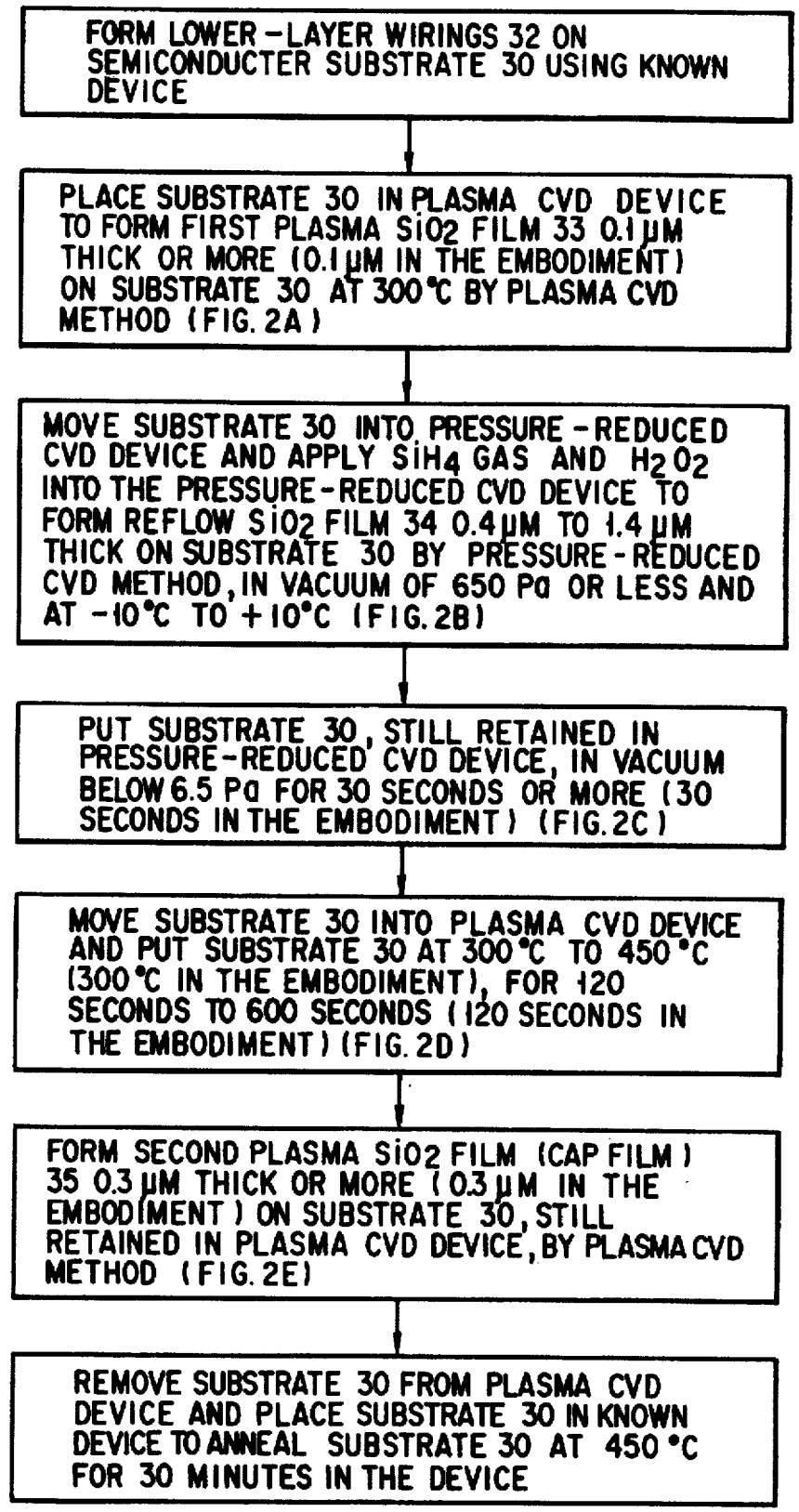
FIG. 4 is a flow chart showing the steps of the embodiment.
Figure 6:
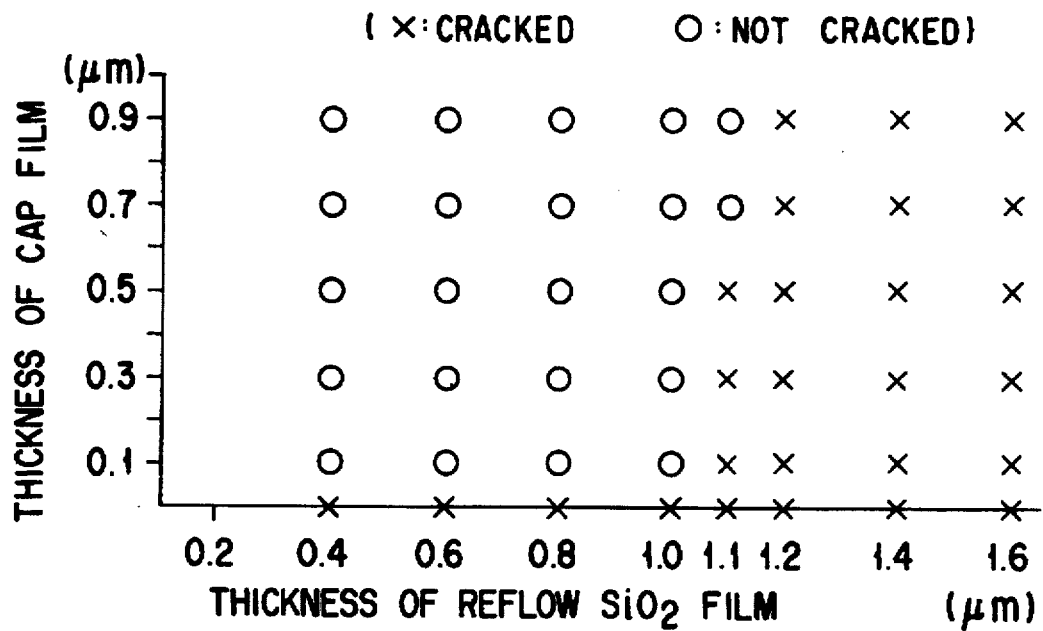
FIG. 6 is a graph showing crack formation when the thickness of a reflow $SiO_2$ film obtained in the steps of forming multi-layered wiring layers when a reflow insulating film forming technique is applied to the steps of forming an interlayered insulating layer in manufacture of a conventional semiconductor device and the thickness of a cap SiO film formed on the reflow $SiO_2$ film are used as parameters.

The above advantage of the present invention will not be obtained if the step of putting the semiconductor substrate 34 in the high temperature is first carried out, and then, the step of putting the semiconductor substrate 34 in vacuum is carried out, as the moisture contained in the reflow $SiO_2$ film 34 will be abruptly changed from 100% to 50% at the step in which the semiconductor substrate is put at the high temperature. FIGS. 3 and 4 are charts showing the flows of the steps of the embodiment. FIG. 3 shows manufacturing procedures themselves, and FIG. 4 shows the manufacturing procedures with reference to the relationship between the plasma CVD device and the reduce-pressure CVD device.

Assume that the thickness of the reflow $SiO_2$ film 34 and the thickness of the plasma $SiO_2$ film (cap film) on the reflow $SiO_2$ after annealing is performed at 450° C. for 30 minutes are used as parameters. In this case, the results obtained by actually measuring the state wherein cracks are formed are shown in FIG. 5.

As is apparent from FIG. 5, the reflow $SiO_2$ film 34 obtained in this embodiment has the same crack characteristics of a reflow $SiO_2$ film on which no cap film is formed. However, when the reflow $SiO_2$ film 34 has the cap film formed thereon, the upper limit of the thickness of the film free from cracks increases from about 1.0 μm (prior art) to 2.0 μm. Therefore, the crack resistance of the reflow $SiO_2$ film 34 is improved.

According to the above embodiment, after the reflow insulating film forming technique is applied to the steps of forming an interlayered insulating layer of the steps of forming multi-layered wiring layers to form the reflow $SiO_2$ film 34, the reflow $SiO_2$ film 34 is put in a vacuum of a predetermined pascal for a predetermined time or more, and the reflow $SiO_2$ film 34 is put at a high temperature for a predetermined time or more.

In this manner, even if moisture is generated during formation of the insulating film in the step of forming the reflow $SiO_2$ film 34 to cause the insulating film to contain moisture, the moisture in the insulating film is reduced in content. Therefore, the reflow $SiO_2$ film 34 having high crack resistance can be obtained.

In this manner, when the crack resistance of the reflow $SiO_2$ film is improved, a desired thickness capable of flattening the reflow $SiO_2$ film can be assured.

Therefore, the flatness of the surface of the interlayered insulating layer can be improved, and serious defects such as disconnection or short circuit of the upper wiring layer can be prevented without adversely affecting the deposition of the upper wiring material on the interlayered insulating layer and patterning the upper wiring material layer.

According to this embodiment, before the cap film 35 is formed on the reflow $SiO_2$ film by a plasma CVD method, a semiconductor wafer is already sufficiently heated up. For this reason, the wet etching rage of the formed film 35 increases. Therefore, in the etching step of forming a through-hole or via-hole in the interlayered insulating layer constituted by the reflow $SiO_2$ film 34 and the cap film 35, an abnormal configuration is not formed at the interface between the cap film and the reflow $SiO_2$ film, the coverage of the upper wiring layer formed in the following steps is not degraded, and a connection failure of the upper wiring layer does not occur.

As described above, according to the method of manufacturing a semiconductor device of the present invention, the crack resistance of a reflow insulating film obtained when the reflow insulating film forming technique is applied to the steps of forming an inter-layered insulating layer of the steps of forming multi-layered wiring layers can be improved, a desired thickness capable of flattening the reflow insulating film can be assured. For this reason, the flatness of the surface of the interlayered insulating layer can be improved, and an upper wiring layer formed after the interlayered insulating layer is formed can be micropatterned.

In addition, abnormal configuration of the interface of the insulating layers in an etching step for forming a through-hole or a via-hole can be prevented. Therefore, the reliability of the upper wiring layer can be improved without degradation of coverage of an upper wiring layer formed in the following steps or a conduction failure of the upper wiring layer.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

supplying an $SiH_4$ gas and $H_2O_2$ in a first chamber in which a semiconductor substrate having a first insulating film formed thereon is placed to cause the $SiH_4$ gas and $H_2O_2$ to react to each other in a vacuum having a first pressure of below 650 Pa within the temperature range of $-10°$ C. to $+10°$ C. to form a reflow $SiO_2$ film having a thickness of 0.4 µm to 1.4 µm on said semiconductor substrate;

reducing the pressure of the vacuum in said first chamber to a second pressure for more than 30 seconds; and putting said semiconductor substrate in a second chamber, at a high temperature of 300° C. to 450° C. for 120 seconds to 600 seconds.

2. A method of manufacturing a semiconductor device according to claim 1, wherein the step of forming said insulating film to the step of forming said reflow $SiO_2$ film are continuously performed in vacuum.

3. A method of manufacturing a semiconductor device according to claim 1, further comprising a step performed after the putting step of the semiconductor substrate at the high temperature, for forming a second insulating film on said reflow $SiO_2$ film.

4. A method of manufacturing a semiconductor device according to claim 3, further comprising a step carried out after said second insulating film forming step, of annealing said semiconductor substrate at a temperature of 450° C. for 30 minutes.

5. A method of manufacturing a semiconductor device, comprising the steps of:

placing a semiconductor substrate with wirings thereon into a reaction chamber of a plasma CVD device of a manufacturing device;

forming a plasma $SiO_2$ film on said semiconductor substrate having a thickness of more than 0.1 µm in the reaction chamber of said plasma CVD device;

moving the semiconductor substrate from the reaction chamber of said plasma CVD device into a reaction chamber of a pressure-reduced CVD device of the manufacturing device;

supplying an $SiH_4$ gas and $H_2O_2$ into the reaction chamber of the pressure-reduced CVD device in which the semiconductor substrate is placed to cause the $SiH_4$ gas and $H_2O_2$ to react to each other in a vacuum having a first pressure of below 650 Pa within the temperature range of $-10°$ C. to $+10°$ C. to form a reflow $SiO_2$ film having a thickness of 0.4 µm to 1.4 µm on said semiconductor substrate;

reducing the pressure of the vacuum in said reaction chamber of the pressure-reduced CVD device to a second pressure vacuum for more than 30 seconds;

moving the semiconductor substrate from the reaction chamber of the pressure-reduced CVD device to the reaction chamber of the plasma CVD device; and putting said semiconductor substrate, in the reaction chamber of the plasma CVD device, at a high temperature of 300° C. to 450° C. for 120 seconds to 600 seconds.

6. A method of manufacturing a semiconductor device according to claim 1, wherein said moving steps are carried out by an arm provided in the manufacturing device.

7. A method of manufacturing a semiconductor device according to claim 5, further comprising a step performed after the putting step of the semiconductor substrate at the high temperature, for forming an insulating film on said reflow $SiO_2$ film.

8. A method of manufacturing a semiconductor device according to claim 7, further comprising a step after the insulating film forming step, of annealing said semiconductor substrate at a temperature of 450° C. for 30 minutes.

9. A method of manufacturing a semiconductor device, comprising the steps of:

supplying an $SiH_4$ gas and $H_2O_2$ in a first chamber in which a semiconductor substrate having an insulating film formed thereon is placed to cause $SiH_4$ gas and $H_2O_2$ to react to each other in a vacuum below 650 Pa within the temperature range of $-10°$ C. to $+10°$ C. to form a reflow $SiO_2$ film having a thickness of 0.4 µm to 1.4 µm on said semiconductor substrate;

reducing the pressure of said first chamber to a vacuum of below 6.5 Pa for 30 seconds; and putting said semiconductor substrate in a second chamber, at a high temperature of 300° C. to 450° C. for 120 seconds to 600 seconds.

10. A method of manufacturing a semiconductor device, comprising the steps of:

placing a semiconductor substrate with wirings thereon into a reaction chamber of a plasma CVD device;

forming a plasma $SiO_2$ film on said semiconductor substrate having a thickness of more than 0.1 µm in the reaction chamber of said plasma CVD device;

moving the semiconductor substrate from the reaction chamber of said plasma CVD device into a reaction chamber of a pressure-reduced CVD device of a manufacturing device;

supplying an $SiH_4$ gas and $H_2O_2$ into the reaction chamber of the pressure-reduced CVD device in which the semiconductor substrate is placed to cause the $SiH_4$ gas and $H_2O_2$ to react to each other in a vacuum below 650 Pa within the temperature range of $-10°$ C. to $+10°$ C. to form a reflow $SiO_2$ film having a thickness of 0.4 μm to 1.4 μm on said semiconductor substrate;

reducing the pressure of said reaction chamber of the pressure-reduced CVD device to a vacuum of below 6.5 Pa for 30 seconds;

moving the semiconductor substrate from the reaction chamber of the pressure-reduced CVD device to the reaction chamber of said plasma CVD device; and putting said semiconductor substrate, in the reaction chamber of the plasma CVD device, at a high temperature of 300° C. to 450° C. for 120 seconds to 600 seconds.

* * * * *

UNITED STATES PATENT AND TRADEMARK OFFICE
CERTIFICATE OF CORRECTION

PATENT NO. : 5,683,940
DATED : November 04, 1997
INVENTOR(S) : Kazuyuki YAHIRO

It is certified that error appears in the above-identified patent and that said Letters Patent is hereby corrected as shown below:

Claim 5, column 10, line 24, after "second pressure", delete "vacuum".

Signed and Sealed this

Fifteenth Day of September, 1998

*Attest:*

BRUCE LEHMAN

*Attesting Officer*     *Commissioner of Patents and Trademarks*